United States Patent
Lu

(10) Patent No.: US 7,591,663 B2
(45) Date of Patent: Sep. 22, 2009

(54) SOCKET CONNECTOR WITH IMPROVED BASE

(75) Inventor: Mao Lu, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/156,880

(22) Filed: Jun. 4, 2008

(65) Prior Publication Data
US 2008/0299791 A1     Dec. 4, 2008

(51) Int. Cl.
    *H01R 13/625*     (2006.01)
(52) U.S. Cl. ...................................... 439/342
(58) Field of Classification Search ............ 439/342, 439/259, 266
    See application file for complete search history.

(56) References Cited

U.S. PATENT DOCUMENTS 6,210,196 B1 *   4/2001   Wang et al. ............... 439/342
7,010,858 B2 *   3/2006   Turner et al. ............. 439/342

\* cited by examiner

*Primary Examiner*—Tho D Ta
(74) *Attorney, Agent, or Firm*—Wei Te Chung

(57) ABSTRACT

An electrical connector (1) for electrically connecting an integrated circuit to a circuit board includes base (10) defining a plurality of receiving grooves (101) arranged in a matrix. The receiving grooves are arranged in rows and columns, one lengthways grid (102a/102b) is defined between every two adjacent columns and one transverse grid (103) is defined between every two adjacent rows. The lengthways grids between different columns have different width.

2 Claims, 6 Drawing Sheets

US 7,591,663 B2

SOCKET CONNECTOR WITH IMPROVED BASE

BACKGROUND OF THE INVENTION

1. Field of the Invention

The present invention relates to an electrical connector, and especially to a socket connector for connection of an IC package and a circuit member.

2. Description of the Related Art

Referring to FIG. 1 and FIG. 2, a conventional electrical connector 3 generally includes a base housing 31, a cover 32 movably mounted on the base housing 31 and a lever 33 movably driving the cover 32 to move along the base housing 31. The lever 13 is retained between the base 31 and the cover 32. An IC package disposed on the top of the cover 32 may connect or disconnect with a circuit board timely while the lever 33 rotates to drive the cover 32' to move along the base housing 31. The conduction area 312 defines a plurality of receiving grooves 313 arranged in a matrix. Each receiving grooves 313 is of a square shape. Between every two adjacent receiving grooves there defines a transverse grid 314 in the X direction and a lengthways grid 315 in the Y direction. All transverse grids 314 in one row are aligned with each other, i.e. with a same width. The same to the lengthways grids.

Referring to FIG. 3, during insert-molding, molten plastic is injected into the mold to form the housing with the groove matrix. The molten plastic is injected into the mold cavity from a sprout and flows in the channels in the Y direction and branches in the X direction The Y plastic flow is a mainstream since the plastic stream flows fast at a high pressure when the plastic immits at a sprout. The molten plastic mostly flows in the Y direction and little branches in the X direction, as a result the transverse grid 321 is thin and easily broken. What's more, a joint of the two branches joints at a middle position of the grids as the broken lines shown. The joints also will cause the base housing be destroyed easily. Hence, a new design which can improve the intensity of the base housing is required.

SUMMARY OF THE INVENTION

Accordingly, an object of the present invention is to provide an electrical connector with improved housing.

In order to achieve the object set forth, an electrical connector for electrically connecting an integrated circuit to a circuit board includes a base defining a plurality of receiving grooves arranged in a matrix. The receiving grooves are arranged in rows and columns, one lengthways grid is defined between every two adjacent columns and one transverse grid is defined between every two adjacent rows. The lengthways grids between different columns have different width.

Other objects, advantages and novel features of the invention will become more apparent from the following detailed description of the present embodiment when taken in conjunction with the accompanying drawings.

DETAILED DESCRIPTION OF THE INVENTION

Figure 1:
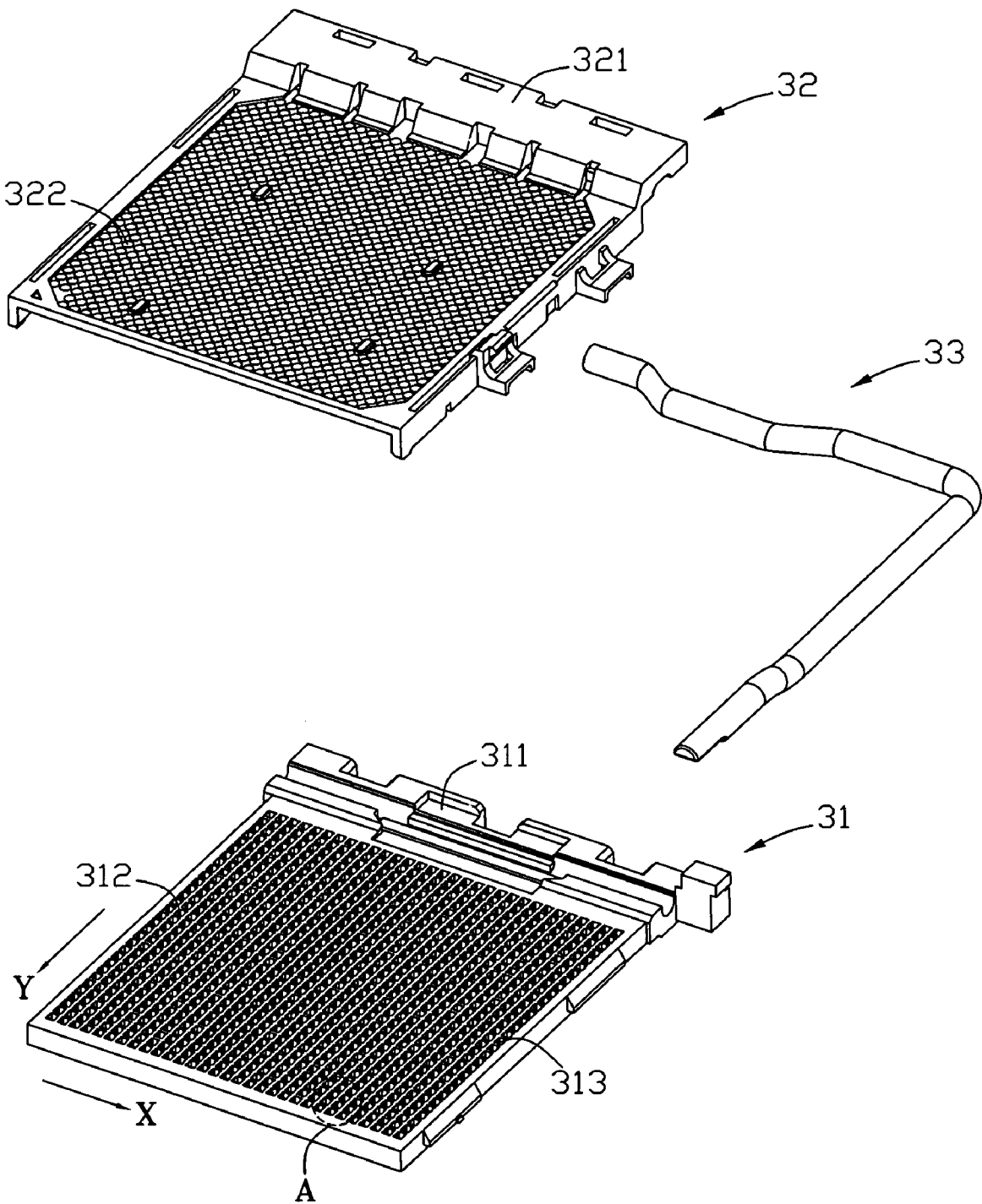
FIG. 1 is an exploded view of a conventional electrical connector.
Figure 2:
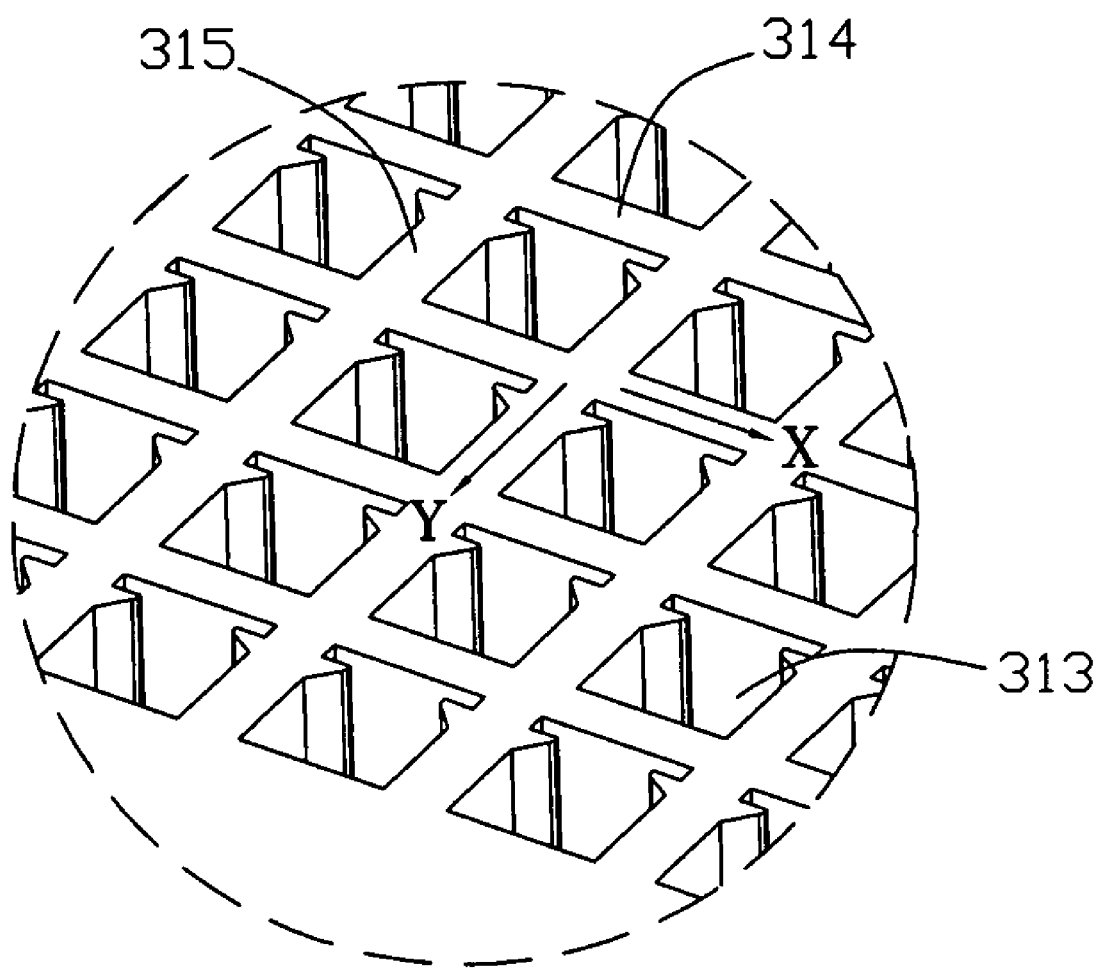
FIG. 2 is an amplificatory portion in the circle A shown in FIG. 1.
Figure 3:
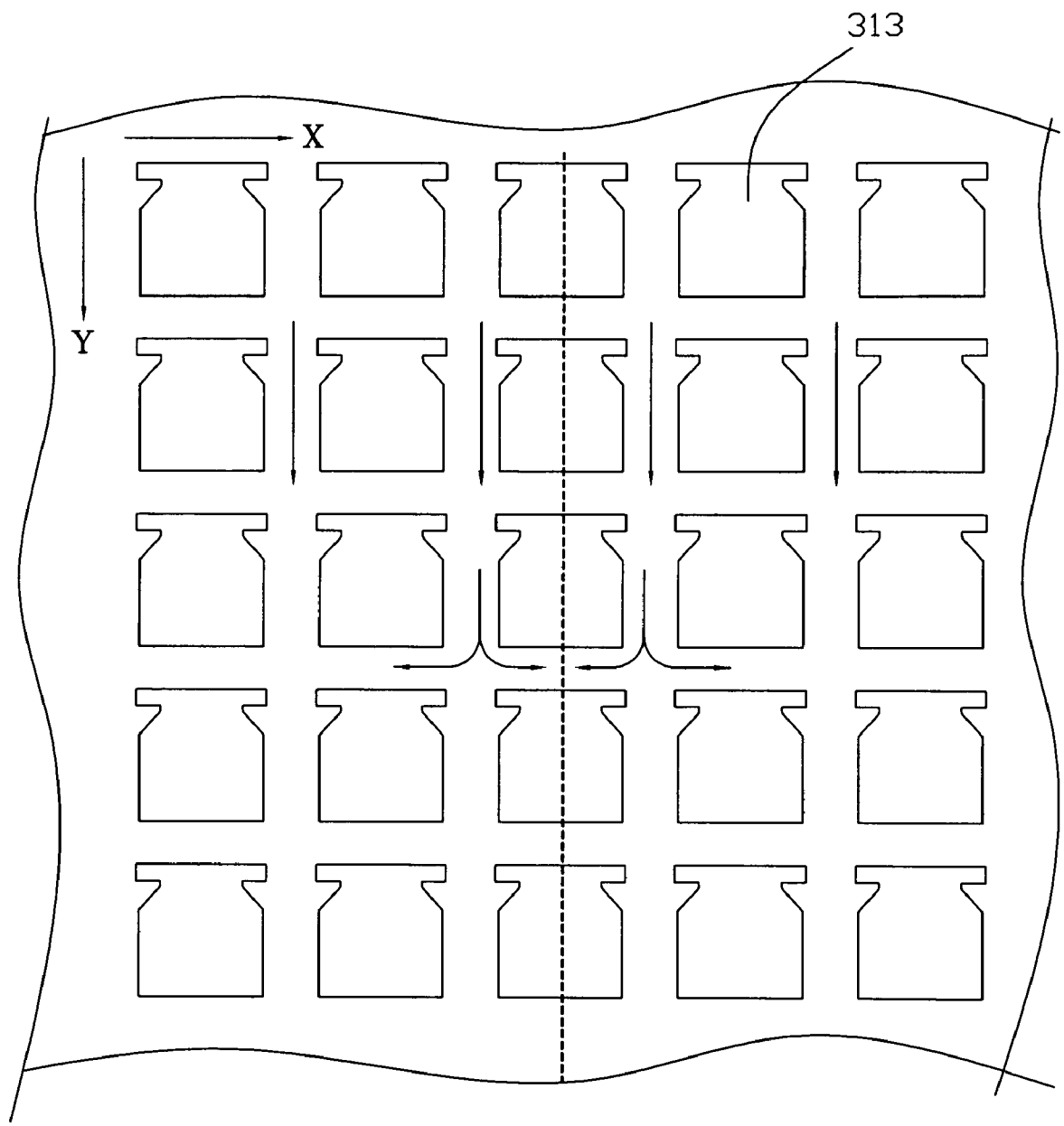
FIG. 3 is a sketch map of the insert-molding of the base.

Reference will now be made to the drawing figures to describe a preferred embodiment of the present invention in detail.

Figure 4:
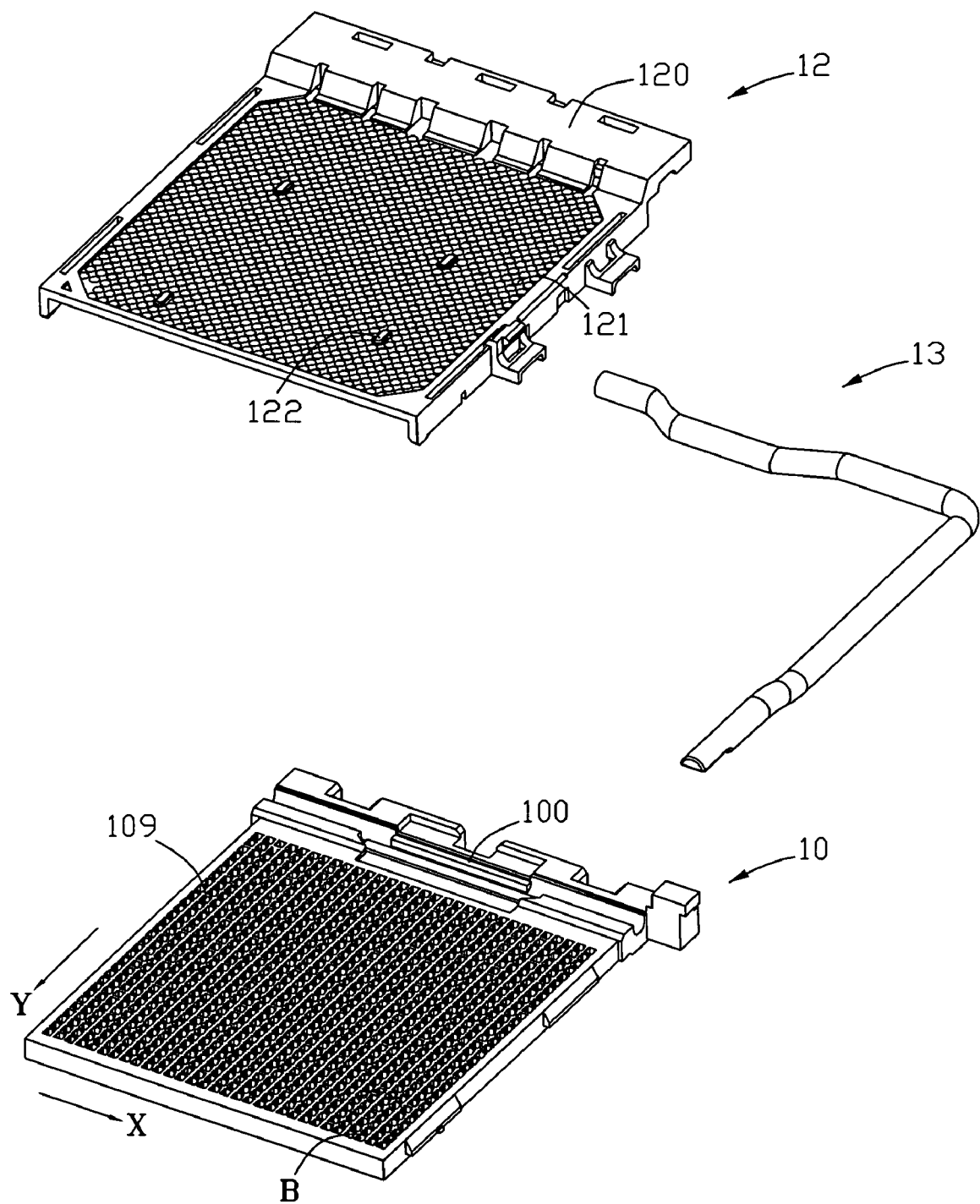
FIG. 4 is an exploded view of an electrical connector in accordance with a preferred embodiment of the present invention.

Referring to FIG. 4, the electrical connector 1 includes a base 10, a cover 12 movably mounted on the base 10 and a lever 13 retained between the base 10 and the cover 12. The plate-like base 10 defines a retaining portion 100 at one end portion and a conduction area 109. The cover 12 defines a cover portion 120 corresponding to the retaining portion 100 and a plurality of openings 121 corresponding to the receiving grooves 101. The cover 12 further defines a plurality of protrusions 122 on the surface thereof for attaching an IC package to prevent the package from distortion. One end of the lever 13 is retained between the retaining portion 100 and the cover portion 120. Driving the other end of the lever 13 and then the cover 12 may move along the base 10.

Figure 5:
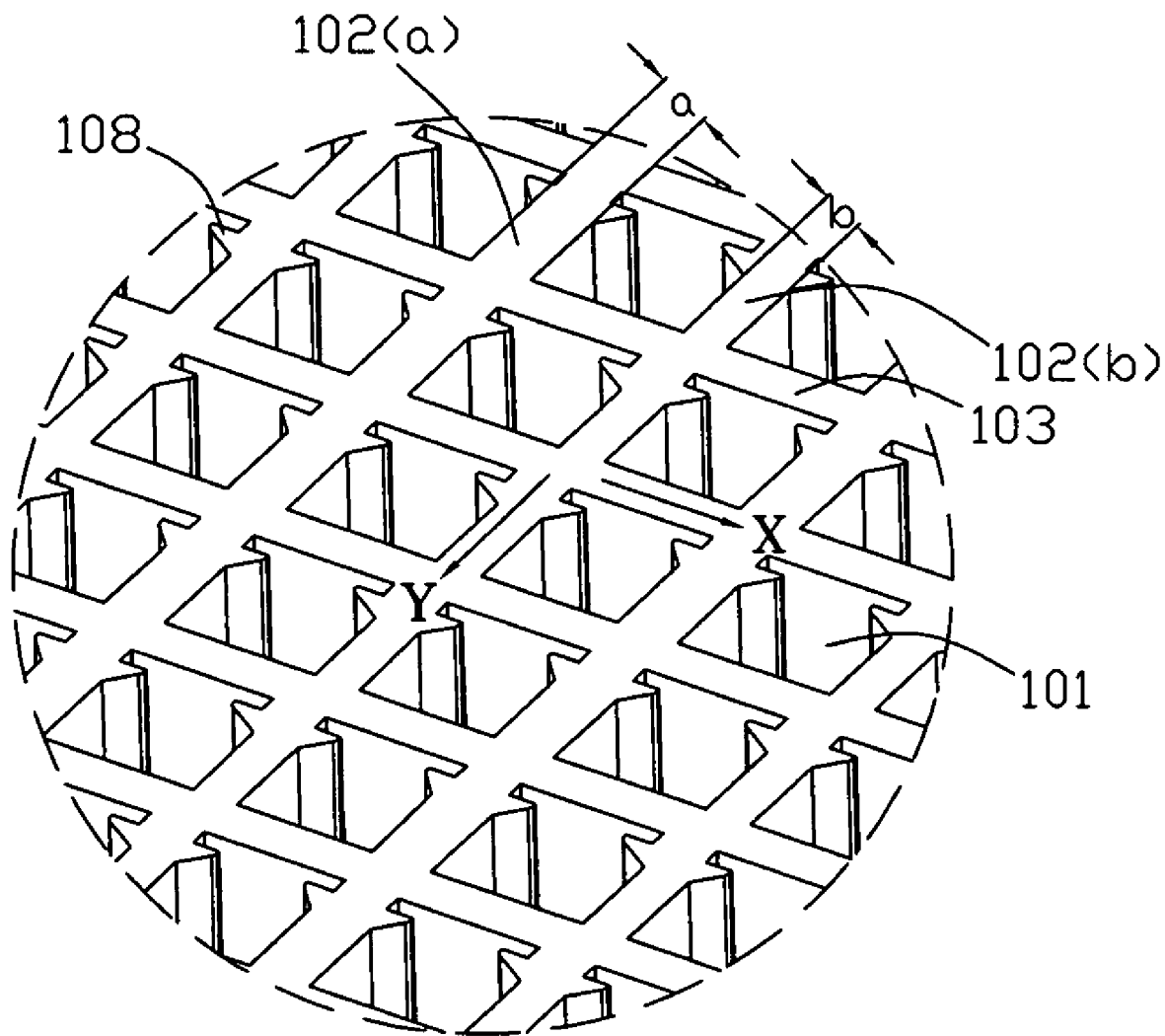
FIG. 5 is a amplificatory portion in the circle B shown in FIG. 4.
Figure 6:
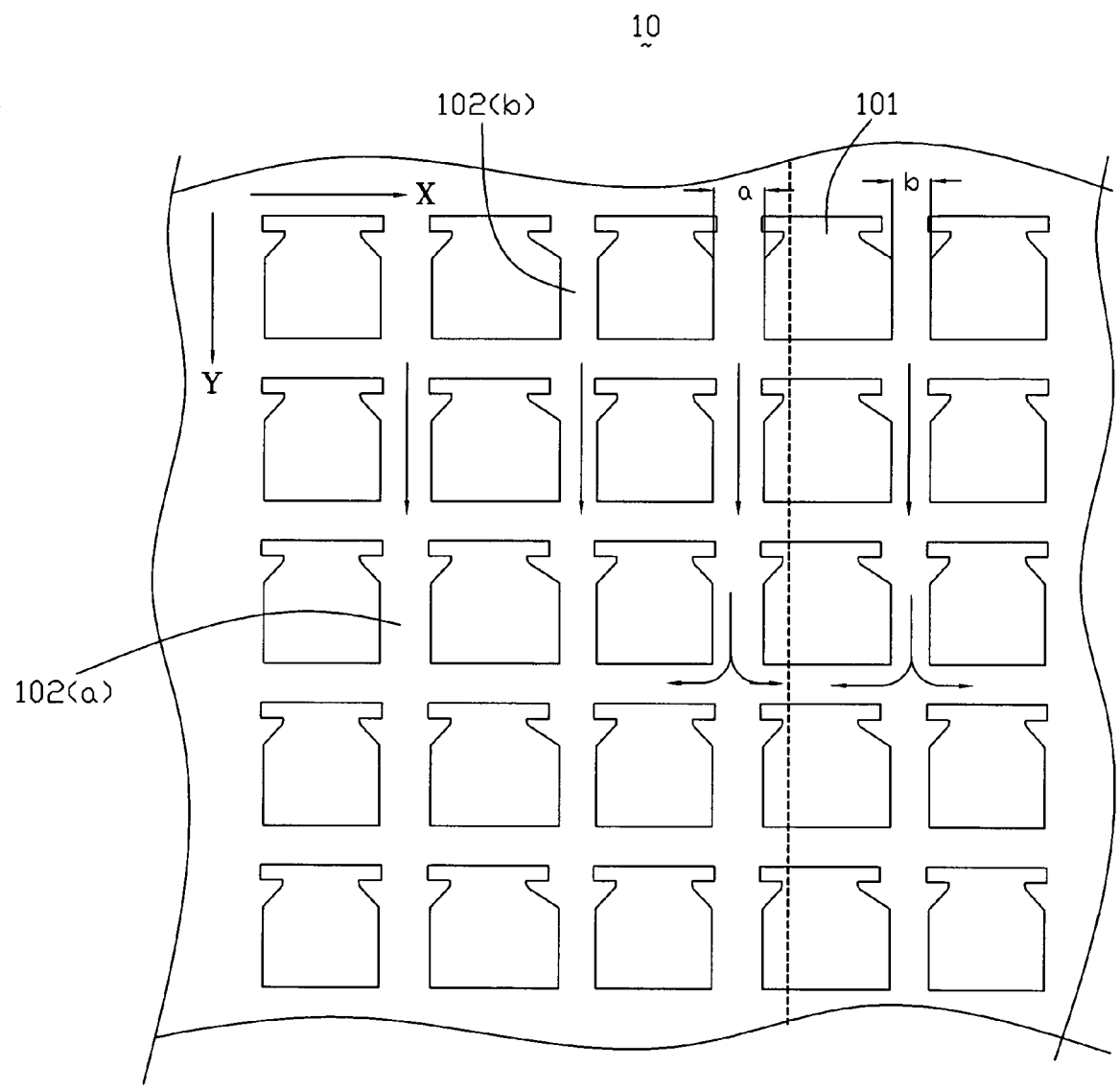
FIG. 6 is a sketch map of the insert-molding of the base shown in FIG. 4.

As FIGS. 5 and 6 shown, the conduction area 109 defines a receiving groove matrix having a plurality of receiving grooves 101, for receiving the conductive terminals. Each receiving groove 101 is of a substantial square shape and a triangular rib portion 108 projects into the groove at opposite inside of the groove. The plurality of grooves 101 are arranged in several rows and columns. The grooves 101 of every column are aligned with each other and a lengthways grid $102(a)/102(b)$ is formed between every two groove columns in a Y direction. The grooves of every row are also aligned with each other and a transverse grid 103 is formed between every two groove rows in an X direction. The rib portions 108 project from the lengthways grids 102. The first lengthways grid $102(a)$ has a width "a" and the second lengthways grid $102(b)$ has a width "b", the width "a" being larger than "b". The first and second lengthways grids are alternately arranged.

Referring to FIG. 6, during insert-molding, a core pin is disposed in the cavity at a place where forms the groove and first and second channels are defined between the core pin to form the grids, to be simple, the channels are numbered as corresponding grids. Molten plastic is injected into the cavity to form the housing with groove matrix. The plastic stream immits into the cavity from a sprout and flows in the channels in the Y direction and branches in the X direction. The plastic stream flows with a high speed in the first channel $102(a)$ since the channel $102(a)$ is widen, while slow in the second channel $102(b)$ compared to the first channel $102(a)$ since the second channel $102(b)$ is respectively narrow. As a result the branch streams in the X direction from the second channels $102(b)$ flows further and is larger than that from the first channels $102(a)$, more molten plastic branches in the X direction. A joint of the two branches offsets to the first lengthways grids $102(a)$ as broken lines shown. Namely, the transverse grids 103 also can be provided with different width. Alternatively the lengthways grids can arrange in any other ways, such as the lengthways grids are designed in more than two different width.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for electrically connecting an integrated circuit to a circuit board, comprising:
a base defining a plurality of receiving grooves arranged in a matrix, the receiving grooves being arranged in rows and columns, one lengthways grid defined between every two adjacent columns and one transverse grid defined between every two adjacent rows;
wherein the lengthways grids between different columns have different width;
wherein the lengthways grids are designed in two different width;
wherein the lengthways grids in two different width are alternately arranged;
wherein each receiving groove defines two rib portions projecting into the groove at opposite inside of the groove;
wherein the rib portions project from the lengthways grids;
wherein each transverse grid defines at least one joint, and the at least one joint offsets to the lengthways grid designed in a larger width;
wherein the electrical connector further comprises a cover movably mounted on the base;
wherein the electrical connector further comprises a lever retained between the base and the cover to drive the cover to move along the base.

2. An electrical connector comprising:
an insulative housing defining a plurality of receiving grooves arranged in columns and rows;
a grid formed between every adjacent two columns of said receiving grooves;
the grids are of two different widths alternately arranged with each another along a direction of said rows;
wherein the receiving grooves are configured with two different kinds alternately arranged with each other in columns;
wherein the electrical connector further comprises a cover movably mounted on the housing;
wherein the electrical connector further comprises a lever retained between the housing and the cover to drive the cover to move along the housing.

* * * * *